United States Patent
Zhang et al.

(10) Patent No.: US 10,832,475 B2
(45) Date of Patent: Nov. 10, 2020

(54) METHOD FOR CONSTRUCTING THREE-DIMENSIONAL SOLID MODEL WITH GEOMETRIC ERROR AND COMPUTER-READABLE STORAGE MEDIUM

(71) Applicant: BEIJING INSTITUTE OF TECHNOLOGY, Beijing (CN)

(72) Inventors: Zhijing Zhang, Beijing (CN); Xin Jin, Beijing (CN); Zhongqing Zhang, Beijing (CN); Xin Ye, Beijing (CN); Qiushuang Zhang, Beijing (CN)

(73) Assignee: BEIJING INSTITUTE OF TECHNOLOGY, Beijing (CN)

( * ) Notice: Subject to any disclaimer, the term of this patent is extended or adjusted under 35 U.S.C. 154(b) by 0 days.

(21) Appl. No.: 16/338,396

(22) PCT Filed: Aug. 18, 2017

(86) PCT No.: PCT/CN2017/098083
§ 371 (c)(1),
(2) Date: Mar. 29, 2019

(87) PCT Pub. No.: WO2018/059155
PCT Pub. Date: Apr. 5, 2018

(65) Prior Publication Data
US 2020/0043231 A1    Feb. 6, 2020

(30) Foreign Application Priority Data
Sep. 29, 2016    (CN) .......................... 2016 1 0866082

(51) Int. Cl.
     *G06T 17/30*      (2006.01)
     *G06T 17/10*      (2006.01)
     *G06F 30/23*      (2020.01)

(52) U.S. Cl.
     CPC .............. *G06T 17/30* (2013.01); *G06F 30/23* (2020.01); *G06T 17/10* (2013.01)

(58) Field of Classification Search
None
See application file for complete search history.

(56) References Cited

U.S. PATENT DOCUMENTS 8,914,257 B1    12/2014    Nestleroad et al.

FOREIGN PATENT DOCUMENTS

| CN | 101692257 A | 4/2010 |
| CN | 103440382 A | 12/2013 |
| CN | 103810343 A * | 5/2014 |
| CN | 105739440 A | 7/2016 |

OTHER PUBLICATIONS

Liu et al. "The Research of Surface Reconstruction in Reverse Engineering based on Characteristic Surface" China Dissertation Database Translation, pp. 11-40, Mar. 2004. (Year: 2004).*

(Continued)

*Primary Examiner* — Nicholas R Wilson
(74) *Attorney, Agent, or Firm* — Harness, Dickey & Pierce, P.L.C.

(57) ABSTRACT

The present disclosure provides a method for constructing a three-dimensional solid model with a geometric error and a computer-readable storage medium. The method includes: S10: obtaining an ideal geometric solid model of a component; S20: constructing a geometric error model for a surface of the component by use of geometric error data of the surface of the component; and S30: replacing a corresponding surface in the ideal geometric solid model with the geometric error model to obtain a three-dimensional solid model with a geometric error. The method for constructing a three-dimensional solid model provided by examples of the present disclosure integrates a geometric error of a component with a CAD model, so as to obtain a three- (Continued)

dimensional solid model with a geometric error, which describes a regular appearance characteristic of a real surface of the component macroscopically, and also reflects an irregular geometric error shape characteristic of the surface of the component microscopically.

11 Claims, 3 Drawing Sheets

(56) References Cited

OTHER PUBLICATIONS

Liu, Junqiang,: "The Research of Surface Reconstruction in Reverse Engineering based on Characteristic Surface", China Dissertation Database, Oct. 2010 (Oct. 13, 2010), pp. 10-44 (with English Abstract).

International Search Report in English and Chinese) and Written Opinion of the International Searching Authority (in Chinese) issued in PCT/CN2018/082442, dated Nov. 27, 2017; ISA/CN.

Office Action issued for corresponding Chinese Patent App. No. 201610866082.7, dated Apr. 16, 2019, and its English translation thereof.

Office Action issued for corresponding Chinese Patent App. No. 201610866082.7, dated Oct. 9, 2019, and its English translation thereof.

Han, Qing-yuo et al. "The Reconstruction Method of NURBS Curves and Surface", North China Electric Power University Mechanic Engineering Department, Baoding, 017003, China, Machinery Design & Manufacture, Mar. 3, 2006, 137-139.

* cited by examiner (a)  (b)

METHOD FOR CONSTRUCTING THREE-DIMENSIONAL SOLID MODEL WITH GEOMETRIC ERROR AND COMPUTER-READABLE STORAGE MEDIUM

CROSS-REFERENCE TO RELATED APPLICATIONS

This application is the U.S. National Phase Application under 35 U.S.C. 371 of International Application No. PCT/CN2017/098083 filed on Aug. 18, 2017, which claims priority to China Patent Application No. CN201610866082.7, filed on Sep. 29, 2016 and entitled "NURBS Curved Surface Reconstruction-Based Geometric Error Representation Method". The disclosures of the above applications are hereby incorporated by reference in their entirety.

TECHNICAL FIELD

The present disclosure relates to the technical field of computer model construction, and particularly relates to a method for constructing a three-dimensional solid model with a geometric error, which integrates a real geometric error into the three-dimensional solid model. The present disclosure also relates to a computer-readable storage medium.

BACKGROUND ART

A problem usually exists in an assembling process of a precision/ultra-precision mechanical system, i.e., under a condition that each component is qualified, the accuracy of the assembled system does not meet a design requirement so that an assembling success rate is low. This is mainly because, besides a size error, each surface of a machined component actually has some geometric errors and the surface microscopically consists of many peaks and valleys in different sizes and shapes. Influence of a geometric error of a surface of a component on assembly quality is mainly reflected by influence of an irregular micro-bulge on the surface of the component on a fitting characteristic and fitting accuracy.

To simulate or predetermine the accuracy of the assembled system, those skilled in the art develop a virtual assembly technology so as to implement assembling verification by use of a three-dimensional model of each component in a computer system. To this end, a component model construction technology is required, and the construction of a three-dimensional model of the component is particularly required.

At present, a computer-aided design (CAD) system is a main component model construction method for virtual assembly. In a current commercial CAD system, common three-dimensional models mainly include a curved surface model and a solid model which represent a three-dimensional body. In this case, the solid model refers to a representation model providing the most comprehensive geometric and topological information of a three-dimensional object. The solid model accurately defines a geometric shape of the three-dimensional object, and is a geometric model expression generally used in three-dimensional CAD systems presently.

However, there is still the limitation that the geometric error information cannot be fully considered in the CAD system at present according to a component solid model construction technology, thus all CAD models used for assembly simulation are ideal models. Factors such as manufacturing errors inevitably exist in an actual production process of a component. There is always a certain deviation between a component actually used for assembly and an ideal model. As such, information of an actual product such as assembly error accumulation, assembly stress, assembly deformation and the like may not be accurately analyzed by assembly simulation analysis.

In addition, although there are many methods for constructing a geometric error model in the prior art, most of these methods are limited to mathematical simulation of a geometric error of a surface of a machined component, so that the error is relatively large, and a geometric error model and a CAD model are not integrated. As such, a three-dimensional solid model with a geometric error may not be constructed, the constructed geometric error model is not applicable to assembly simulation, and furthermore, the influence of the geometric error on assembly accuracy and assembly performance may still not be analyzed.

In view of the above, it is impossible for an existing virtual assembly technology to accurately simulate or predetermine the accuracy of the assembly system.

SUMMARY OF THE INVENTION

In view of the above present situation, a main objective of the present disclosure is to disclose a construction method for a three-dimensional solid model, which can integrate the geometric error of a component with a CAD model, thereby obtaining the three-dimensional solid model with the geometric error and further simulating or predetermining system accuracy after assembly through a virtual assembly technology.

To this end, the technical solution adopted by the present disclosure is as follows.

A method for constructing a three-dimensional solid model with a geometric error, including:
  obtaining an ideal geometric solid model of a component;
  constructing a geometric error model for a surface of the component by use of geometric error data of the surface of the component; and
  replacing a corresponding surface in the ideal geometric solid model with the geometric error model to obtain a three-dimensional solid model with a geometric error.

Another objective of the present disclosure is to provide a computer-readable storage medium storing a computer program, wherein when the computer program is run by a processor, the steps of the construction method for a three-dimensional solid model with a geometric error provided by the present disclosure can be implemented.

DETAILED DESCRIPTION OF THE INVENTION

Figure 1:
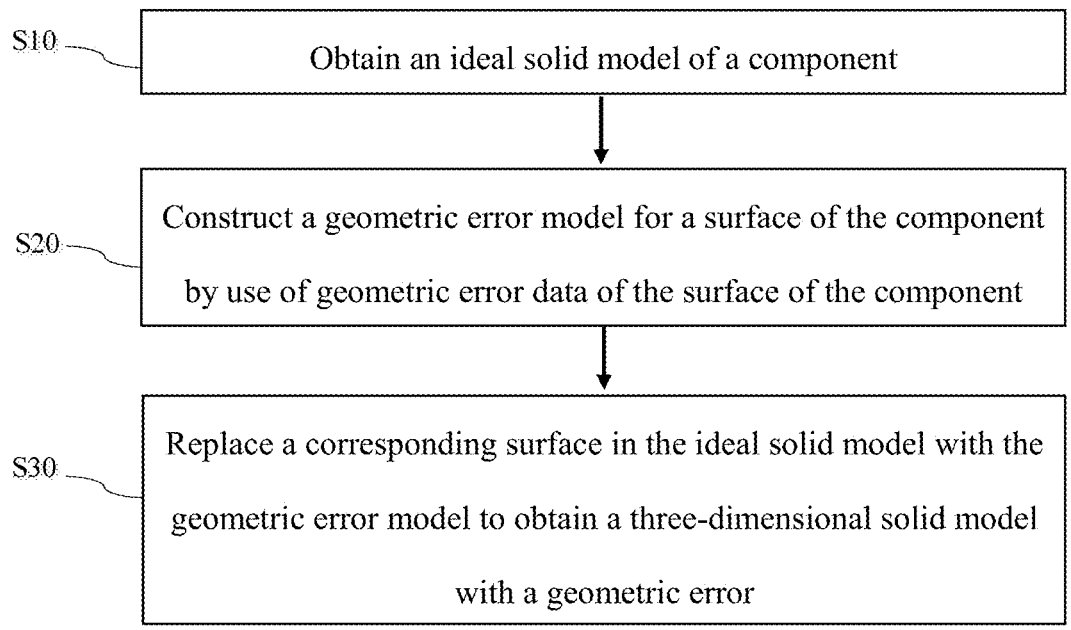
FIG. 1 is a flowchart illustrating a method for constructing a three-dimensional solid model with a geometric error according to an example of the present disclosure.

A three-dimensional body is usually represented in a computer by a wire frame model, a surface model, or a solid model. Information of the three-dimensional body stored by the wire frame model and the surface model is incomplete. The solid model may represent the three-dimensional body completely and unambiguously. Therefore, the solid model is a main way for representing a design object of engineering and manufacturing in a current CAD system. In the CAD system, a geometric solid model is a model used for describing geometric information such as a shape, a size, a position and a structural relationship of a product. In the current CAD system, geometric solid model representation methods mainly include three classes: Constructive Solid Geometry (CSG) representation, Boundary Representation (Brep), and CSG/Brep mixed representation.

The Brep (i.e., Boundary Representation) represents a solid by describing a boundary of the solid, which is an unambiguous solid model representation method in three-dimensional geometric modeling. The boundary representation is to describe a three-dimensional object using a finite number of curved surfaces as boundary surfaces of the object. These curved surfaces divide the object into an interior and an exterior. As long as the boundary of the solid is defined, the solid is uniquely defined. These curved surfaces include: a plane, a quadric surface (such as a cylindrical surface, a conical surface and a spherical surface), and/or a freeform curved surface (such as a B-spline curved surface and a NURBS curved surface). NURBS is an abbreviation of Non-Uniform Rational B-Splines.

There are two types of information to be expressed in Brep: one is geometric information, which reflects a size and a position of an object; and the other is topological information, which illustrates a connection relationship among a body, a surface, an edge and a vertex.

The geometric information refers to basic geometric element information such as a point, a curve and a surface of a model, and may describe a size, a dimension, a position and a shape of a component body, such as a coordinate value of a vertex, a component surface (curved surface) equation parameter, and the like.

The topological information is information describing the number and type of topological node elements on the component body, as well as a mutual relationship of the topological node elements. The topological information usually describes a topological relationship between three-dimensional solid geometric elements by an eight-hierarchy structure of "body->lump->shell->face->loop->coedge->edge->vertex". An adjacency relationship of object surfaces is determined according to the topological information.

Therefore, in the Brep method, all pieces of geometric information constituting the body and topological information connected thereto are recorded in detail according to the hierarchies "body->lump->shell->face->loop->coedge->edge->vertex". These pieces of information may be obtained directly during various calculations and operations, thus it is easy to perform a local operation. The local operation does not change an overall structure of the body from a macro point of view, and makes a local modification.

The information related to the method for constructing a three-dimensional solid model provided by examples of the present disclosure is described above. The method for constructing a three-dimensional solid model with a geometric error provided by examples of the present disclosure will be described in detail below.

A basic flow of the method for constructing a three-dimensional solid model with a geometric error provided by examples of the present disclosure is shown in FIG. 1. The method mainly includes following operations.

In step S10, an ideal geometric solid model of a component is obtained, i.e., an ideal geometric solid CAD model.

In step S20, a geometric error model of a surface of the component is constructed using geometric error data of the surface of the component.

In step S30, a corresponding surface in the ideal geometric solid model is replaced with the geometric error model to obtain a three-dimensional solid model with a geometric error.

In this case, step S10 and step S20 are performed in an unlimited order, which may be interchanged, or may be performed synchronously.

Hereinafter, the specific implementation process of the method for constructing a three-dimensional solid model provided by examples of the present disclosure will be described in detail with reference to examples.

In step S10, the ideal geometric solid model of the component may be constructed in a CAD system, or a constructed ideal geometric solid model may be imported. For example, a local coordinate system of a current real geometric characteristic (e.g., a geometric solid of the component) may be constructed in, e.g., a Creo system. A point, a curve and a surface of the geometric characteristic are generated according to a structure, a nominal size, a nominal angle and a nominal position of the current geometric characteristic to obtain an ideal geometry of the geometric characteristic, that is, to obtain the ideal geometric solid model of the component.

In step S20, the geometric error data of the surface of the component may be obtained by direct measurement, for example, by direct measurement through an error measuring tool such as a three-dimensional scanner directly connected to a computer, or previously measured error data may be imported into the computer. The geometric error data may then be used for constructing a geometric error model. Specifically, a geometric error NURBS curved surface model of the surface may be constructed by use of the geometric error data. An exemplary construction process will be described in detail later.

In step S30, the NURBS surface model with geometric error obtained in step S20 may be imported into the Creo system as an IGES formatted file under the same coordinate system as that in step S10, and a surface model with geometric error in CAD is constructed to determine a real surface of the component. The real surface is determined as a Brep data source of the three-dimensional solid model with the geometric error, in which Brep data includes geometric information and topological information.

Further, corresponding Brep data may be extracted based on the ideal geometric solid CAD model, and geometric element information of an ideal point, an ideal curve and an ideal surface of the CAD model and a topological structure relationship between the geometric elements may be obtained. A corresponding geometric element data table and a topological element data table are constructed according to data structures of geometric data and topological data. In addition, Brep data of the geometric error curved surface CAD model may be extracted by use of the same manner. A variation surface, a variation curve and a variation point, namely real geometric elements (a surface, a curve and a point) with errors, are obtained, and a corresponding data structure table is constructed. In specific implementation, the corresponding Brep data may be extracted based on a Creo secondary development technology.

Then, Brep data of a corresponding ideal geometric element in a Brep data structure of the ideal geometric solid CAD model of the component is replaced with the Brep data of the geometric error curved surface CAD model (i.e., Brep data of the variation surface, the variation curve and the variation point), and a topological structure of the ideal CAD model is unchanged. As such, a NURBS-Brep data structure of a real geometric solid model is constructed. That is, in the method provided by examples of the present disclosure, the idea of separating the geometric information from the topological information is adopted, the topological structure of the ideal geometric solid model is unchanged, and the corresponding geometric element information is modified.

Figure 2A:
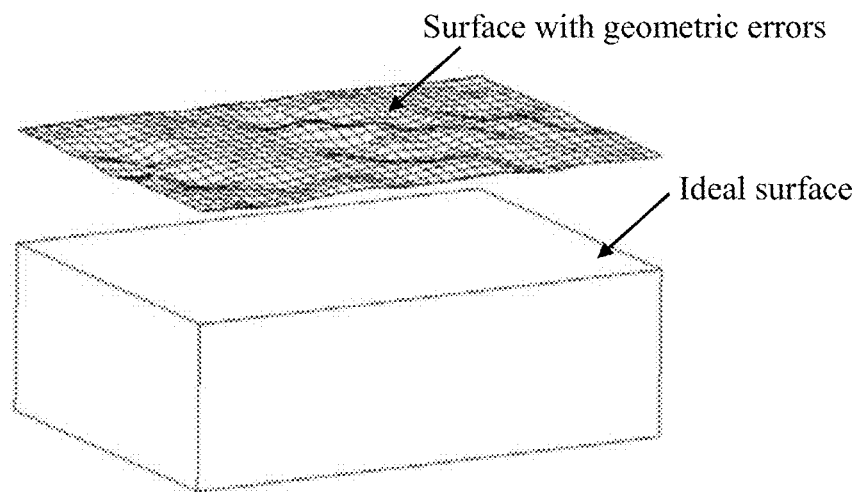
FIG. 2 is a schematic diagram illustrating an SAT file-based process for generating a geometric solid model of a component.
Figure 2B:
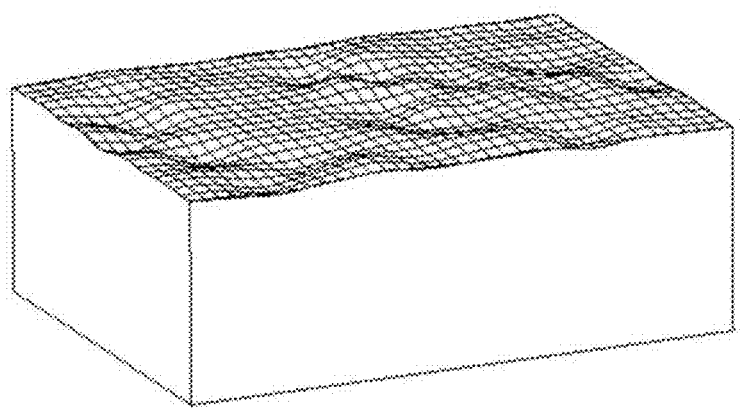

In order to implement the above process, topological data of the NURBS-Brep data structure and geometric data associated with the topological data may be directly written into an SAT file according to the topological information of the CAD model and an SAT file data format, and the SAT file is directly restored and imported into the CAD system through an exchange interface between the SAT file and the Creo system according to a mapping relationship between the CAD system and the SAT file. That is, the geometric error may be effectively integrated with underlying data of the CAD model, so as to quickly generate the three-dimensional solid model with the geometric error. An SAT file-based process for generating a geometric solid model of a component is shown in FIG. 2. In the figure, one surface of a cube component is taken as an example, (a) is a schematic diagram of the surface before replacement, and (b) is a schematic diagram of the surface after replacement.

After the above data integration is completed, the CAD model may be regenerated. That is, the integrated data is analyzed in the CAD system to reconstruct the three-dimensional solid model with the geometric error, and a topology integrity check may be performed so as to avoid disrupting the topological structure of the CAD model.

The above described process for constructing the three-dimensional solid model involves three important aspects:

(1) The Brep data of the geometric solid model is extracted based on the Creo secondary development technology, and a geometric element data table and a topological information data table are constructed.

(2) Based on the idea of separating the Brep geometric information of the geometric solid model from the topological information, the topological information is kept unchanged, the geometric information is modified, and the geometric error is integrated with the underlying data of the CAD model.

(3) The geometric solid model is reconstructed based on the SAT file format. The geometric error is superimposed on the ideal geometric solid model of the component to effectively integrate the geometric error with the underlying data of the CAD model, generate the three-dimensional solid model with the geometric error, and construct a real geometric solid characteristic of the component in the CAD system.

In the method for constructing a three-dimensional solid model provided by examples of the present disclosure, a geometric error of one surface may be superimposed on the ideal geometric solid model of the component, or geometric errors of a plurality of surfaces may be superimposed simultaneously or one by one.

In the method for constructing a three-dimensional solid model provided by examples of the present disclosure, the SAT file is a storage file of the topological information and geometric information of the geometric solid model. In specific implementation, the topological data and the associated geometric element information may be written into a text file in a row mode in accordance with a standard format of the SAT file.

The process of integrating the geometric error with the underlying data of the CAD model may include two steps as follows:

Step (1) the topological information and geometric information of the Brep data is extracted.

Step (2) the geometric solid model is reconstructed based on the SAT file format.

Figure 3:
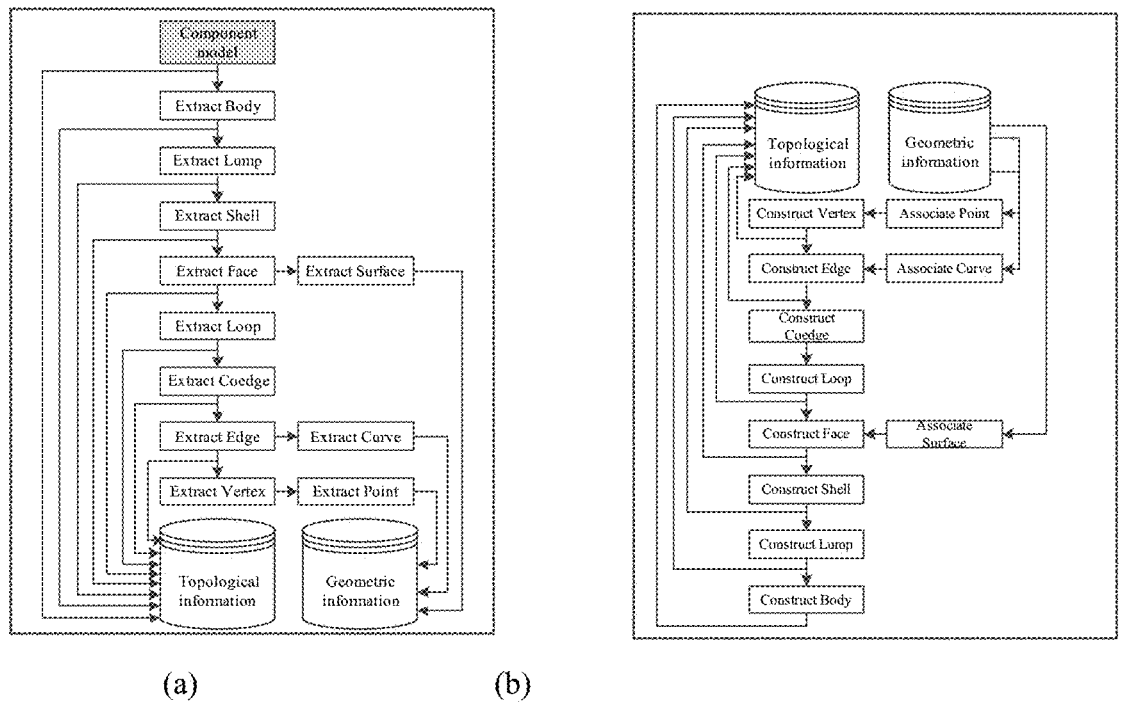
FIG. 3 is a schematic diagram illustrating a Brep data extraction and reconstruction process.

For Step (1), as shown in FIG. 3(a), the specific process includes:

A1: a topological structure tree of the geometric solid model is traversed from top to bottom, topological elements are extracted one by one from a topological top node according to a topological information hierarchical relationship, and a data structure of a topological element is constructed.

A2: for each topological element node, geometric element data is extracted when the node has an associated geometric element, and a data structure of a geometric element is constructed.

A3: topological element information and geometric element information may be stored respectively in corresponding databases, and a complete Brep data structure of the solid model is constructed, namely a geometric element table and a topological element table. In this case, the geometric element table is constructed according to the data structure of the geometric element (i.e., a point, a curve and a surface), and corresponding information is stored. The topological element table is constructed according to the data structure of the topological element "body->lump->shell->face->loop->coedge->edge->vertex", and corresponding information is stored.

For Step (2), as shown in FIG. 3(b), the specific process includes:

B1: a mapping relationship among various topological nodes in a topological structure is established from bottom to top, and geometric information is associated with a corresponding topological node to establish a mapping relationship between a topological element and a geometric element.

B2: the data structure of the topological element is kept unchanged, the data structure of the geometric element is modified, ideal geometric data is deleted, and geometric data of the NURBS curved surface of the surface of the component is inserted. That is, related Brep data is modified and replaced, a corresponding operation such as retaining, repairing, adding and abandoning is performed on Brep information, the ideal geometric data is deleted, and the geometric data of the error surface is inserted.

B3: topological data and geometric data of a target model may be associated, the topological information and the modified geometric information may be written into the SAT file according to the SAT file format, the geometric solid model is reconstructed through a data exchange interface between the SAT file and the CAD system to generate the three-dimensional solid model with the geometric error, and finally integrate the geometric error and the CAD model.

The idea of separating geometric information from topological information is an important three-dimensional geometric design idea of a Brep geometric solid model. Based on this design idea, in the Brep solid model, the geometric element data and the topological element data may be independently stored in a computer, and the CAD system establishes a mapping relationship between the geometric element data and the topological element data through an association operation to accurately express the three-dimensional geometric model. Therefore, the extraction and reconstruction of the geometric element data and the topological element data in the CAD model are relatively independent. As such, in the present disclosure, the geometric element data and the topological element data may be respectively extracted, then the topological element data is unchanged, and the corresponding geometric element data (i.e., coordinates of a point, an equation of a curve and a surface, etc.) is modified. The modification of the geometric element data does not affect the topological element data, thus the geometric error is effectively integrated with the CAD model. For example, in the case of a cube component, a topological structure of a solid model with a geometric error is exactly the same as a topological structure of an ideal cube model. There is only a difference in geometric information between the two models. The difference is that boundaries of the ideal cube are straight lines and planes, while boundaries of the solid model with the geometric error are curves and surfaces.

A premise of integrating the geometric error data of the surface of the component with the CAD three-dimensional solid model data of the component is that a geometric error curved surface mathematical model of the surface of the component may be accurately expressed in the CAD system. In the present disclosure, in step S20 a NURBS curved surface mathematical model may be used for characterizing an actual geometric error curved surface of the component surface, and a geometric error NURBS curved surface mathematical model is constructed based on actual measurement data of the component surface.

Therefore, an implementation process of step S20 may include following steps:

S210: geometric error measurement data of the surface of the component may be obtained. For example, geometric error data measurement may directly be performed on the surface of the component by use of a high precision measuring instrument such as a coordinate measuring machine to obtain measurement data with a double ordering topological rectangular grid characteristic of the surface of the component, in which a topological rectangular grid includes (n+1)×(m+1) data points, and double ordering refers to ordered arrangement of rectangular domain matrices in two directions.

S220: the measurement data may be pre-processed. For example, probe radius compensation, outlier elimination, and the like, may be performed on the measurement data obtained in step S210, to obtain a regular measurement data matrix of the surface of the component, i.e., a rectangular domain matrix, in which a data point in a $k^{th}$ row and $l^{th}$ column on the rectangular domain matrix is $Q_{k,l}$ (k=0, 1, ..., n; l=0, 1, ..., m).

S230: degrees of a NURBS surface may randomly be determined as p and q, and a weight factor of the data point $Q_{k,l}$ may randomly be determined as $w_{k,l}=1$.

S240: the data point may be parameterized. For example, the rectangular domain matrix $Q_{k,j}$ obtained at step S220 may be parameterized respectively in a row direction u and a column direction v by use of an averaging technology to obtain node parameters $\bar{u}_k$ and $\bar{v}_j$, and further obtain node vectors U and V.

For example, a specific method for calculating the node parameter $\bar{u}_k$ and the node vector U is:

$$\bar{u}_0 = 0, \bar{u}_n = 1$$

$$\begin{cases} d = \sum_{k=1}^{n} \sqrt{|Q_k - Q_{k-1}|} \\ \bar{u}_k = \bar{u}_{k-1} + \frac{\sqrt{|Q_k - Q_{k-1}|}}{d} \end{cases} (k = 1, 2, \ldots, n-1) \Rightarrow$$

$$\begin{cases} U = \left\{ \underbrace{0, 0, \ldots, 0}_{p+1}, u_{p+1}, \ldots, u_n, \underbrace{1, 1, \ldots 1}_{p+1} \right\} \\ u_{j+p} = \frac{1}{p} \sum_{i=j}^{j+p-1} \bar{u}_i, i = 1, 2, \ldots, n-p \end{cases};$$

Similarly, the node parameter $\bar{v}_j$ and the node vector V may be calculated.

S250: NURBS surface interpolation and reverse calculation may be performed to obtain coordinates of all control points $P_{k,l}$, k=0, 1, ..., n; l=0, 1, ..., m. For example NURBS curve interpolation is performed for m+1 times by use of the node vector U and the parameter $\bar{u}_k$, which includes: respectively constructing, for l=0, 1, ..., m, curves interpolated to points $Q_{0,l}, Q_{1,l} \ldots Q_{n,l}$ to obtain coordinates of intermediate control points $C_{i,0}, C_{i,1} \ldots C_{i,m}$. Then, NURBS curve interpolation is performed for n+1 times by use of the node vector V and the parameter $\bar{v}_j$, which includes: respectively constructing, for i=0, 1, ... n, curves interpolated to points $C_{i,0}, C_{i,1} \ldots C_{i,m}$ to obtain the coordinates of all control points $P_{k,l}$, k=0, 1, ..., n; l=0, 1, ..., m.

S260: the geometric error model of the surface of the component is constructed through NURBS surface reconstruction, in which a real geometric form error mathematical model for the surface of the component is constructed by use of a NURBS surface reconstruction technology taking the coordinates of all control points $P_{k,l}$, k=0, 1, ..., n; l=0, 1, ..., m obtained in step S250 as parameters of the NURBS surface according to the degrees p and q of the NURBS surface and the weight factor $w_{k,l}$ determined in step S230 and the node vectors U and V calculated in step S240, and a geometric error curved surface model is generated by positive calculation.

Specifically, an implementation process of step S250 is described as follows:

According to a NURBS curved surface equation, and a curved surface is strictly subjected to each data point, a following formula is obtained:

$$Q_{k,l} = \sum_{i=0}^{m} \sum_{j=0}^{n} P_{i,j} R_{i,p}(\bar{u}_k) R_{j,q}(\bar{v}_l) =$$

$$\sum_{i=0}^{m} \left[ \sum_{j=0}^{n} P_{i,j} R_{j,q}(\bar{v}_l) \right] R_{i,p}(\bar{u}_k) = \sum_{i=0}^{m} R_{i,p}(\bar{u}_k) C_{i,l}(\bar{v}_l)$$

in which $C_{i,l}(\bar{v}_l) = \sum_{j=0}^{n} R_{j,q}(\bar{v}_l) P_{i,j}$, $R_{i,p}(u)$ represents a rational basis function of a p-NURBS curve determined by an $i^{th}$ data point,
$R_{j,q}(v)$ represents a rational basis function of a q-NURBS curve determined by a $j^{th}$ data point,
$P_{i,j}$ represents a control point of the NURBS surface.

As such, an operation may be performed as follows:

(a) the NURBS curve interpolation is performed for m+1 times by use of the node vector U and the parameter $\bar{u}_k$, including: respectively constructing curves interpolated to points $Q_{0,l}, Q_{1,l} \ldots Q_{n,l}$ for l=0, 1, ... m, and constructing a matrix equation as follows:

$$\sum_{i=0}^{n} R_{i,p}(\bar{u}_k) C_{i,l} = Q_{k,l}$$

written in a matrix form:

$$\begin{bmatrix} R_{0,p}(\bar{u}_0) & \ldots & R_{n,p}(\bar{u}_0) \\ R_{0,p}(\bar{u}_1) & \ldots & R_{n,p}(\bar{u}_1) \\ \vdots & \ddots & \vdots \\ R_{0,p}(\bar{u}_n) & \ldots & R_{n,p}(\bar{u}_m) \end{bmatrix} \begin{bmatrix} C_{0,l} \\ C_{1,l} \\ \vdots \\ C_{n,l} \end{bmatrix} = \begin{bmatrix} Q_{0,l} \\ Q_{1,l} \\ \vdots \\ Q_{n,l} \end{bmatrix}$$

An intermediate control point $C_{i,l}$ is obtained by solving the matrix equation.

(b) NURBS curve interpolation is performed for n+1 times by use of the node vector V and the parameter $\bar{v}_j$, including: respectively constructing curves interpolated to points $C_{i,0}, C_{i,1} \ldots C_{i,m}$ for i=0, 1, ... n, and constructing a matrix equation as follows:

$$\sum_{j=0}^{m} R_{j,q}(\bar{v}_l) P_{i,j} = C_{i,l}$$

written in a matrix form:

$$\begin{bmatrix} R_{0,p}(\bar{v}_0) & \ldots & R_{m,p}(\bar{v}_0) \\ R_{0,p}(\bar{v}_1) & \ldots & R_{m,p}(\bar{v}_1) \\ \vdots & \ddots & \vdots \\ R_{0,p}(\bar{v}_m) & \ldots & R_{m,p}(\bar{v}_m) \end{bmatrix} \begin{bmatrix} P_{i,0} \\ P_{i,1} \\ \vdots \\ P_{i,m} \end{bmatrix} = \begin{bmatrix} C_{i,0} \\ C_{i,1} \\ \vdots \\ C_{i,m} \end{bmatrix}$$

All control points $P_{i,j}$ are obtained by solving the matrix equation.

Figure 4A:
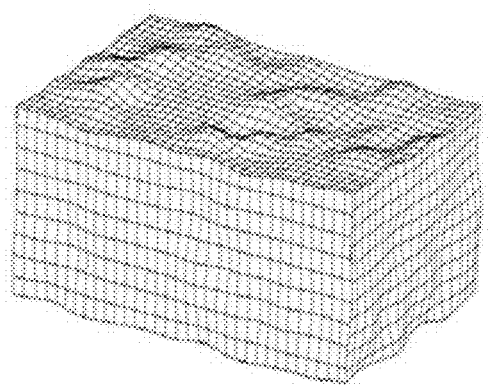
FIG. 4 is a schematic diagram illustrating an example of a real geometric solid model of a component with common geometric characteristics.
Figure 4B:
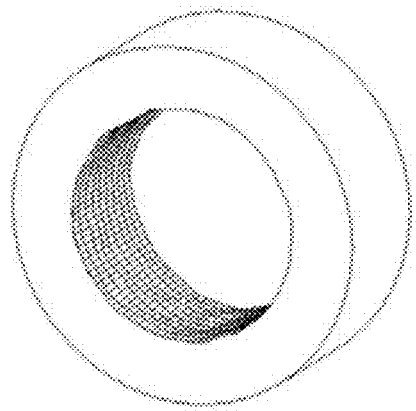
Figure 4C:
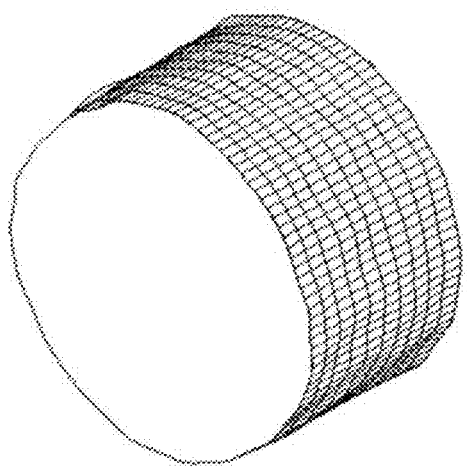

The real geometric solid model of the component includes dimensional deviation, positional deviation and irregular surface form errors, and reflects geometric characteristics of an actual machined surface of the component. FIGS. 4(a) to 4(c) illustrate an example of a real geometric solid model of a component with common geometric characteristics. In the figures, (a) is a real geometric solid model of a cube component with geometric errors of a plurality of surfaces, (b) is a real geometric solid model of a ring-shaped component with a geometric error of an inner cylindrical surface, and (c) is a real geometric solid model of a shaft component with a geometric error of an outer cylindrical surface. In order to more significantly reflect the form errors in the model, the errors are magnified for 100 times in a height direction. The real geometric solid model of the component may describe a regular appearance characteristic of a real surface of the component macroscopically, and may also reflect an irregular geometric error detailed characteristic of the surface of the component microscopically.

In summary, the method for construction a three-dimensional solid model provided by examples of the present disclosure may be summarized as: constructing an ideal three-dimensional model of a component using an existing CAD software, which is the basis for constructing a real geometric solid model of the component; constructing a CAD curved surface model describing a geometric error of a real surface of the component by use of a geometric error model construction method based on NURBS reconstruction; according to the Brep-based design idea of separating geometric data of the solid model with topological data, respectively extracting geometric data and topological data of Brep data of the ideal three-dimensional model, replacing ideal surface geometric data with geometric error curved surface data, and integrating with the topological data organically to effectively integrate the geometric error with underlying data of the CAD model, and construct a corresponding three-dimensional solid model with a geometric error; finally, after performing check, test and supplement modification on the model, outputting a real geometric solid model of the component, which facilitates analysis and utilization.

In order to better implement the above method, examples of the present disclosure also propose that a geometric error NURBS curved surface mathematical model is accurately expressed in a CAD model system based on an IGES data interface, and a geometric error curved surface CAD model is constructed. That is, a parameter of the geometric error NURBS curved surface mathematical model reconstructed by actual measurement data of the surface of the component is stored in an IGES format, the NURBS curved surface model is converted into a standard IGES file, and then the file is imported into an existing CAD system to generate a geometric error CAD curved surface model.

Based on the above method for constructing a three-dimensional solid model with a geometric error, the present disclosure also provides a computer-readable storage medium storing a computer program, where when the computer program is run by a processor, the operations of the method for constructing a three-dimensional solid model with a geometric error provided by the present disclosure may be implemented.

The above are exemplary examples of the present disclosure and are not intended to limit the present disclosure. As will occur to those skilled in the art, the present disclosure is susceptible to various modifications, combinations and changes. Any modifications, equivalent replacements, improvements and the like made within the spirit and principle of the present disclosure should be included within the scope of claims of the present disclosure.

The invention claimed is:

1. A method for constructing a three-dimensional solid model with a geometric error, comprising:
generating, in a computer-aided design (CAD) system, a point, a curve and a surface of a geometric solid according to as structure, a nominal size, a nominal angle and a nominal position of the geometric solid of a component to construct an ideal geometric solid model of the component;
constructing a geometric error model for a surface of the component by use of geometric error data of the surface of the component; and
replacing a corresponding surface in the ideal geometric solid model with the geometric error model to obtain a three-dimensional solid model with a geometric error.

2. The method according to claim 1, wherein the geometric error model is a Non-Uniform Rational B-Splines (NURBS) surface model with the geometric error.

3. The method according to claim 2, wherein the constructing the geometric error model for the surface of the component by use of the geometric error data of the surface of the component comprises:

obtaining measurement data of the surface of the component, wherein the measurement data has a double ordering topological rectangular grid characteristic and a topological rectangular grid comprises (n+1)×(m+1) data points;

preprocessing the measurement data to obtain a rectangular domain matrix, wherein a data point in a kth row and lth column on the rectangular domain matrix is $Q_{k,l}$ (k=0, 1, . . . , n; l=0, 1, . . . , m);

determining that degrees of a NURBS surface are p and q and a weight factor of the data point $Q_{k,l}$ is $W_{k,l}$=1;

parameterizing the rectangular domain matrix $Q_{k,j}$ in a row direction u and a column direction v by use of an averaging technology respectively to obtain node parameters $\bar{u}_k$ and $\bar{v}_j$ and further obtain node vectors U and V;

performing NURBS surface interpolation and reverse calculation to obtain coordinates of all control points $P_{k,l}$, k=0, 1, . . . , n; l=0, 1, . . . , m; and constructing the geometric error model for the surface of the component taking the coordinates of all control points $P_{k,l}$, k=0, 1, . . . , n; l=0, 1, . . . , m as parameters of the NURBS surface according to the degrees p and q of the NURBS surface and the weight factor $w_{k,l}$ and the node vectors U and V.

4. The method according to claim 3, wherein the performing NURBS surface interpolation and reverse calculation to obtain coordinates of all control points $P_{k,l}$, k=0, 1, . . . , n; l=0, 1, . . . , m comprises:

performing NURBS curve interpolation for m+1 times by use of the node vector U and the parameter $\bar{u}_k$; and performing the NURBS curve interpolation for n+1 times by use of the node vector V and the parameter $\bar{v}_j$.

5. The method according to claim 4, wherein the performing the NURBS curve interpolation for m+1 times by use of the node vector U and the parameter $\bar{u}_k$ comprises:

respectively constructing, for l=0, 1, . . . m, curves interpolated to points $Q_{0,l}$, $Q_{1,l}$ . . . $Q_{n,l}$ to obtain the coordinates of the intermediate control points $C_{i,0}$, $C_{i,1}$ . . . $C_{i,m}$;

wherein the performing the NURBS curve interpolation for n+1 times by use of the node vector V and the parameter $\bar{v}_j$ comprises:

respectively constructing, for i=0, 1, . . . n, curves interpolated to points $C_{i,0}$, $C_{i,1}$ . . . $C_{i,m}$ to obtain the coordinates of all control points $P_{k,l}$, k=0, 1, . . . , n; l=0, 1, . . . , m.

6. The method according to claim 1, further comprising: importing the geometric error model into a CAD system as an IGES formatted file, and constructing a surface model with the geometric error in the CAD system to determine a real surface of the component, wherein the real surface is determined as a Brep data source of the three-dimensional solid model with the geometric error.

7. The method according to claim 6, wherein after the Brep data source is determined, the method further comprises:

extracting Brep data of the ideal geometric solid model, obtaining geometric element information about an ideal point, an ideal curve and an ideal surface of the CAD model and a topological structure relationship between geometric elements, and constructing a geometric element data table and a topological element data table according to data structures of geometric data and topological data; and/or, extracting Brep data of the surface model with the geometric error in the CAD system, obtaining geometric element information about a variation surface, a variation curve and a variation point and a topological structure relationship between geometric elements, and constructing a geometric element data table and a topological element data table according to data structures of geometric data and topological data.

8. The method according to claim 6, further comprising: replacing the Brep data of corresponding ideal geometric elements in a Brep data structure of the ideal geometric solid model with the Brep data of the surface model with the geometric error in the CAD system, unchanging a topological structure of the ideal geometric solid model, and constructing a NURBS-Brep data structure of a real geometric solid model.

9. The method according to claim 8, further comprising: after data replacement is completed, analyzing the replaced data in the CAD system, and constructing the three-dimensional solid model with the geometric error.

10. The method according to claim 9, wherein the analyzing the replaced data in the CAD system and constructing the three-dimensional solid model with the geometric error comprises:

writing the topological data and the geometric data of the NURBS-Brep data structure into an SAT file, and restoring and importing the SAT file into the CAD system through an exchange interface between the SAT file and the CAD system, so as to obtain the three-dimensional solid model with the geometric error through analysis.

11. A non-transitory computer-readable storage medium storing a computer program, wherein when the computer program is run by a processor, the method for constructing a three-dimensional solid model with a geometric error according to claim 1 is implemented.

* * * * *